United States Patent
Verkuil et al.

(10) Patent No.: US 6,202,029 B1
(45) Date of Patent: Mar. 13, 2001

(54) NON-CONTACT ELECTRICAL CONDUCTION MEASUREMENT FOR INSULATING FILMS

(76) Inventors: Roger L. Verkuil, 37 Sherwood Hts., Wappinger Falls, NY (US) 12590; Gregory S. Horner, 3717 Carlysle Ave., Santa Clara, CA (US) 95051; Tom G. Miller, 7077 Fox Hill Dr., Solon, OH (US) 44139

( * ) Notice: Subject to any disclaimer, the term of this patent is extended or adjusted under 35 U.S.C. 154(b) by 0 days.

(21) Appl. No.: 09/597,503

(22) Filed: Jun. 20, 2000

Related U.S. Application Data

(62) Division of application No. 08/841,501, filed on Apr. 23, 1997, now Pat. No. 6,097,196.

(51) Int. Cl.$^7$ .............................. G01R 31/26; G01R 31/28
(52) U.S. Cl. ........................ 702/64; 324/750; 250/492.2; 438/17
(58) Field of Search ..................... 702/64, 65; 324/750, 324/765, 766, 767; 250/492.2; 438/14, 17

(56) References Cited

U.S. PATENT DOCUMENTS

| | | | |
|---|---|---|---|
| 4,812,756 | * 3/1989 | Curtis et al. | 324/158 R |
| 5,025,145 | 6/1991 | Lagowski . | |
| 5,498,974 | 3/1996 | Verkuil et al. . | |
| 5,561,387 | * 10/1996 | Lee | 324/765 |
| 5,661,408 | * 8/1997 | Kamieniecki et al. | 324/765 |
| 5,757,693 | * 6/1998 | Verkuil | 324/767 |
| 5,773,989 | * 6/1998 | Edelman et al. | 324/765 |
| 5,834,941 | * 11/1998 | Verkuil | 324/455 |
| 5,907,764 | * 5/1999 | Lowell et al. | 438/17 |
| 5,963,783 | * 10/1999 | Lowell et al. | 438/17 |
| 6,011,404 | * 1/2000 | Ma et al. | 324/765 |
| 6,069,017 | * 5/2000 | Kamieniecki et al. | 438/17 |
| 6,097,196 | * 8/2000 | Verkuil et al. | 324/750 |
| 6,104,206 | * 8/2000 | Verkuil | 324/765 |

FOREIGN PATENT DOCUMENTS 53-84029    1/1980    (JP) .

OTHER PUBLICATIONS

Cosway et al., "Uses of Corona Oxide Silicon (COS) Measurements for Diffusion Process Monitoring and Troubleshooting", IEEE, Aug. 1998.*

Cosway et al., "Manufacturing Implementation of Corona Oxide Silicon (COS) Systems for Diffusion Furnace Contamination Monitoring", IEEE, Jul. 1997.*

Horner et al., "COS–Based Q–V Testing: In–line Options for Oxide Charge Monitoring", IEEE, 1995.*

Outside Electrochemical Society Publication, 1985, Abstract No. 284, pp. 415–416.

* cited by examiner

*Primary Examiner*—Patrick Assouad
(74) *Attorney, Agent, or Firm*—Pearne & Gordon LLP

(57) ABSTRACT

A corona source is used to apply charge to an insulating layer. The resulting voltage over time is used to determine the current through the layer. The resulting data determines a current-voltage characteristic for the layer and may be used to determine the tunneling field for the layer.

10 Claims, 3 Drawing Sheets

NON-CONTACT ELECTRICAL CONDUCTION MEASUREMENT FOR INSULATING FILMS

This application is a divisional application of U.S. patent application Ser. No. 08/841,501, now U.S. Pat. No. 6,097, 196 filed Apr. 23, 1997.

BACKGROUND OF THE INVENTION

The present invention relates to the field of semiconductor wafer testing and, more particularly, to the measurement of the electronic conduction behavior of various insulating layers.

The production of insulating layers, particularly, thin oxide layers, is basic to the fabrication of integrated circuit devices on semiconductor wafers. A variety of insulating dielectric layers are used for a wide range of applications. These insulating layers can be used, for example, to separate gate layers from underlying silicon gate regions, as storage capacitors in DRAM circuits, for electrical device isolation and to electrically isolate multilayer metal layers. The electrical insulating properties of these layers is of great interest. Some of the measures of the electrical insulating quality of these layers are (1) the conduction current at a given applied voltage or applied electric field strength, (2) the voltage or electric field strength corresponding to a given applied conduction current and (3) the terminal value of a saturating increase in voltage or electric field strength (tunneling field) corresponding to a regime of rapidly increasing conduction with increasing voltage or field.

Another property of interest, related to the insulating properties of an insulating layer is the electrical breakdown voltage of the dielectric layer. Voltage can be increased across an insulating layer until a sudden increase in conduction current is observed. If this current is due to a localized fault or a physical pinhole in the dielectric, then it is often referred to as a defect breakdown. If the current is due to a field induced impact ionization mechanism that takes place rather uniformly over the entire cross section of the dielectric, then the field produced by the applied voltage (i.e., voltage over thickness of the dielectric) is considered to be the intrinsic breakdown field of the material.

It is noted that for thermal oxides (e.g., silicon dioxide), for example, the tunneling currents can be so high as to tend to obscure the intrinsic breakdown characteristic of the material.

Various methods involving the use of contacts at the oxide surface have been used for measurement of current-voltage behavior. These methods suffer from sensitivity to pinholes in the oxide and from localized breakdown effects associated with the contacting electrodes.

A typical approach has been to deposit a metal layer on top of the oxide and to then apply a test voltage to the oxide. This not only affects the measurement, but also will typically spoil the test wafer.

The current-voltage behavior of an insulator can be influenced by the composition of the layer as well as the thermodynamic growth conditions of the layer. Other perturbing influences can be electron trapping states in the layer, polarity dependent carrier injection from the silicon and the particular type of deposited electrode that is used to perform the measurements. Quite often, particularly for thin oxides, the ability to make measurements is thwarted by pinholes in the layer that become localized highly conductive paths after a measurement electrode is deposited. The present invention is advantageously insensitive to localized faults and pinholes.

U.S. Pat. No. 5,498,974 is incorporated herein in its entirety by reference. The patent discloses an apparatus for depositing corona charge on an insulating layer and for measuring the voltage on the surface of the layer.

SUMMARY OF THE INVENTION

A method for measuring a current-voltage characteristic for an insulating layer on a substrate includes depositing increments of corona charge on the layer, measuring the derivative of a voltage resulting from a reduction of the charge with respect to time, and determining from the voltage and voltage derivative the current-voltage characteristic.

A method for measuring tunneling field for an oxide layer on a semiconductor wafer including (a) depositing an increment of corona charge on the layer, (b) measuring a voltage across the layer, (c) pausing an increment of time, (d) repeating steps b and c until the voltage saturates, and (e) using the saturation voltage to determine the tunneling field.

A method for measuring tunneling field for an oxide layer on a semiconductor wafer including depositing a predetermined value of excess charge on the layer, measuring a voltage across the layer, and determining tunneling field in accordance with the voltage.

DESCRIPTION OF THE PREFERRED EMBODIMENTS

Figure 1:
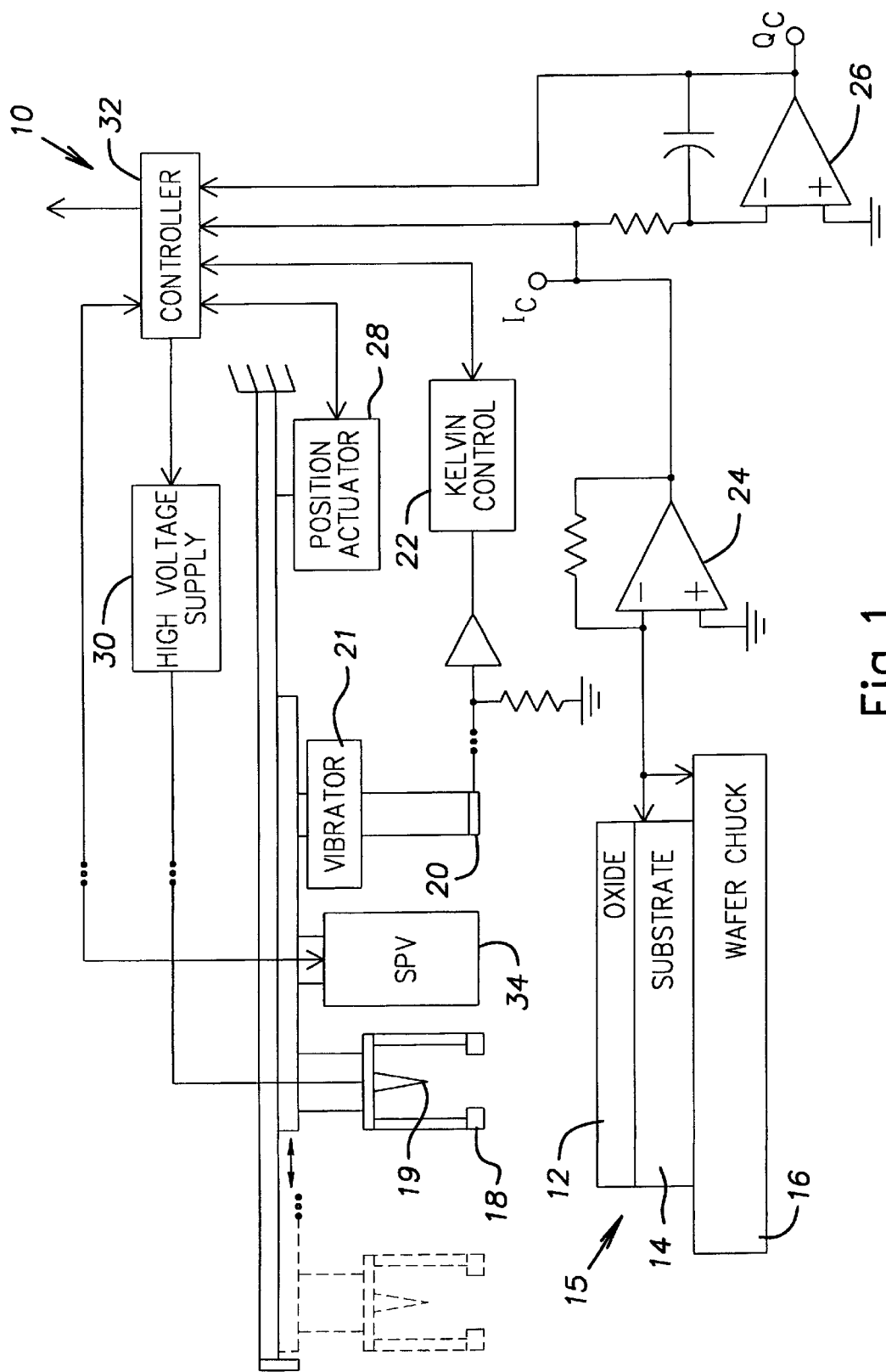
FIG. 1 is a schematic diagram of an apparatus for practicing the invention.

Referring to FIG. 1, an apparatus 10 for measuring the current-voltage characteristic for an oxide 12 on a substrate 14 of a semiconductor wafer 15 may include a wafer chuck 16, corona gun 18, a Kelvin probe 20, a Kelvin control 22, a current to voltage converter 24, a current integrator 26, a position actuator 28, a high voltage supply 30, and a controller 32.

The wafer chuck 16 holds the wafer 15 during the measurement process and provides a grounding contact to the substrate 14 of the wafer 14. The grounding contact can be obtained, for example, from a high pressure contact using a sharp tungsten carbide needle.

The high voltage supply 30 supplies high voltage (e.g., 6–12 Kv to the corona gun 18 to produce positive or negative corona charges depending on the polarity of the supply 30. In the preferred embodiment, the gun 18 includes one or more needles 19 connected to the high voltage supply 30.

The Kelvin probe 20 is an electrode attached to a vibrator 21. Movement of the probe 20 above a charged surface results in an AC voltage representative of the potential of the charged surface. The Kelvin control 22 converts the AC voltage to a signal corresponding to the voltage of the surface.

Current flowing through the wafer 15 from the corona gun 18 is converted to a voltage by the current to voltage converter 24. This voltage (current) is integrated by the charge integrator 26 to provide a measure of the charge deposited by the corona gun 18 on the oxide 12. The circuits thus provide a coulombmeter.

A position actuator 28 may be provided to move the corona gun 18 and the Kelvin probe 20 over the wafer 15.

The controller 32 controls the operation of the apparatus 10. The controller 32 controls the position actuator 28 and the high voltage supply 30 in response to the Kelvin controller 22, the current to voltage converter 24 and the current integrator 26. Based on the method set forth below, the controller 32 can provide a measurement 34 of the I-V behavior. The controller 32 may be, for example, a dedicated microprocessor-based controller or a general purpose computer.

For ease of understanding the description below we will assume the measurement of the I-V characteristic of a thermal oxide on a P minus silicon substrate with a negative polarity corona. However, it should be understood that the method of the invention is applicable to a variety of insulating or dielectric layers grown and/or deposited on substrates of semiconductor materials or metals. The charge used can be positive or negative, as appropriate.

The oxide current $I_{OX}$ may be expressed as the product of the oxide capacitance per unit area $C_{OX}$ and the derivative with respect to time of the voltage across the oxide ($dV_{OX}/dt$).

$C_{OX}$ can be calculated from $E_O \cdot E_{OX}/T_{OX}$. Where $E_O$ is the permitivity of free space, 8.86E-14 farads/cm, $E_{OX}$ is the relative dielectric constant of the oxide (3.9 for thermal oxide), $T_{OX}$ is the thickness of the oxide in centimeters.

The derivative of $V_{OX}$ can be approximated by the change in $V_{OX}$, $\Delta V_{OX}$ during a time $\Delta t$ in seconds.

An increment of charge as determined by the current integrator 26 is deposited on the oxide surface by the corona gun 18 and the voltage $V_{OX}$ measured by the Kelvin probe 20. After a delay, $\Delta t$, $V_{OX}$ is measured again. This then gives a value for $dV_{OX}/dt$ which is used to determine $I_{OX}$. This change in voltage results from the reduction of charge over the interval $\Delta t$. The time $\Delta t$ used varies with the oxide thickness and is picked to provide the desired sensitivity for measuring the oxide current. The increments of charge can also be summed to provide the cumulative deposited charge $Q_{OX}$.

In general, it may also be necessary to remove any undesired charge from the surface of the dielectric layer before starting the measurements. This may be accomplished by measuring the voltage with the Kelvin probe 20 and applying charge with the corona gun 18 until the oxide voltage is at a typically low value (e.g., −2 volts for a 1,000 Å oxide) corresponding to a low field and a slight degree of silicon accumulation. As a first approximation, the voltage reading of the Kelvin probe, $V_{KP}$ will be equal to $V_{OX}$. This approximation will hold very well for thick oxides (e.g., greater than 2,000 Å), where the work function difference, $V_{WF}$, between the Kelvin probe and the silicon bulk can sometimes be ignored and where the silicon surface potential, $V_{Si}$, (which is in series with $V_{KP}$) can also sometimes be ignored.

In order to estimate the actual value of the oxide voltage, $V_{OX}$, $V_{KP}$ must be corrected for the fact that $V_{KP} = V_{OX} + V_{WF} + V_{Si}$. Therefore, $V_{WF}$ and $V_{Si}$ are first estimated and subtracted from $V_{KP}$. $V_{WF}$ can be estimated by first substituting a material, with a predetermined, known work function, such as gold or graphite, in place of the wafer and then measuring $V_{KP}$.

$V_{Si}$ can be estimated from a surface photovoltage measurement, SPV, using a very high light intensity source such as xenon flash. Devices for making SPV measurements are well-known in the art. For a given value of SPV and a reasonably estimated value of excess optically induced carrier generation, delta n, there will be an approximate corresponding value of $V_{Si}$ that can be calculated from a theoretical model, such as that of E. O. Johnson, Phys. Rev., Vol. 111, No. 1. The first order effect in the Johnson model is that the magnitude of SPV tends to approach $V_{Si}$ and delta n becomes comparable to and larger than the silicon doping concentration. It is noted that delta n can also be estimated from Johnson, based on a SPV measurement in strong accumulation and in. strong inversion.

For more accuracy and/or thinner oxides, the above corrections can be employed.

In the preferred embodiment, the oxide layer 12 starts at zero volts, either inherently or by the application of the appropriate polarity and quantity of corona charge by the corona gun 18.

Then a negative increment of corona charge $\Delta Q_c$ is deposited onto the oxide surface by the corona gun 18. This results in a first oxide voltage $V_{OX1}$ being measured by the Kelvin probe 20.

After a pause, $\Delta t$, the Kelvin probe 20 measures a second oxide voltage $V_{OX2}$. The difference between the voltages is used with $\Delta t$ to determine $I_{OX}$.

The incrementing of the corona charge $\Delta Q_c$ and the calculation of the resulting $I_{OX}$ continues until an I-V characteristic of interest has been generated.

Figure 2:
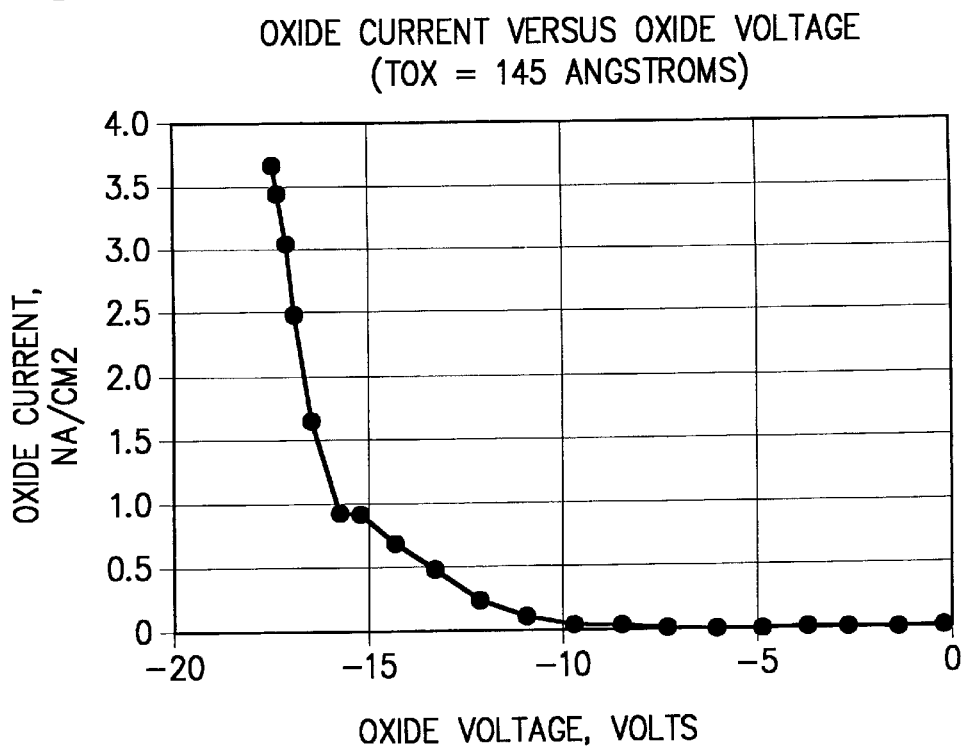
FIG. 2 is an exemplary graph of current versus voltage for a thin oxide under test.

Referring to FIG. 2, a graph of I-V results from the above method for a thermal oxide layer with a thickness of 143 Å is shown. The $\Delta t$ used was 15 seconds. The charge increment was about 3.3E-7 coulombs/cm².

Figure 3:
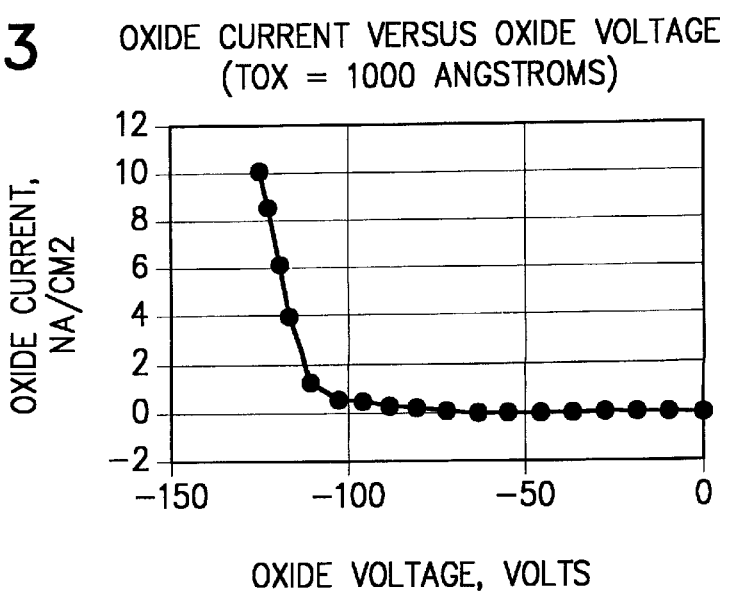
FIG. 3 is an exemplary graph of current versus voltage for a thick oxide under test.

Referring to FIG. 3, a graph of I-V results from the above method for a thermal oxide layer with a thickness of 1,000 Å is shown. The $\Delta t$ used was 60 seconds. The charge increment was about 3.3E-7 coulombs/cm².

The V-I graphs in FIGS. 2 and 3 can be used to identify the oxide voltage or electric field at a given conduction current. Conversely, FIGS. 2 and 3 can also be used to identify the conduction current corresponding to a given value of oxide voltage or field strength. In addition, the likely existence of a particular conduction mechanism of interest, can be postulated by curve-fitting various oxide conduction models to the I-V behavior in FIGS. 2 and 3. For example, conduction due to tunneling. behavior would tend to exhibit an I-V characteristic $I = V_{OX}^2 * \exp(-b/V_{OX})$, where b is a constant. This tunneling behavior occurs, for example, in thermal oxides. Conduction due to field enhanced thermal excitation of carriers from bulk oxide traps (known as Frenkel-Poole Emission) would tend to exhibit and I-V characteristic $I = V^* \exp(f(T,V))$, where $f(T, V)$ is a function of temperature and the voltage across the dielectric, V. Frenkel-Poole Emission is observed, for example, for silicon nitride layers.

The accuracy of the I-V characteristic can be further improved by correcting for $V_{WF}$ and $V_{Si}$ (in case of substrates other than silicon, other surface potentials can be evaluated).

The work function of a material is defined as the energy required to remove an electron from the Fermi level, physically extract it from the material and then move it an infinite distance away from the material. $V_{WF}$ can-be expressed as the work function difference between the work function of the Kelvin probe electrode, $W_{KP}$, and the work function of the silicon bulk, $W_{Si}$, of the wafer under test. While $W_{Si}$ is known to be about 4.8 eV, $W_{KP}$ is usually unknown and may drift due to dipole effects from adsorbed air molecules.

$W_{KP}$ can be determined by making a calibrating Kelvin probe measurement, $V_{KP2}$ of a material having a predetermined effective work function, $W_{REF}$, in place of the wafer 12. For example, highly oriented pyrolytic graphite may be used as a reference material. This graphite has the advantage that a freshly cleaved surface can be obtained by applying and removing a piece of adhesive tape from the surface. This fresh surface allows for very repeatable measurements of $W_{KP}$, where $W_{KP=VKP2}-W_{REF}$. It follows then that $V_{WF}=V_{KP2}+W_{REF}-W_{Si}$.

The resulting value for $V_{WF}$ is then subtracted from $V_{KP}$ by the controller 32 to provide a corrected value for $V_{OX}$.

The SPV tool 34 is used to make an SPV measurement using a very high intensity light source such as a xenon flash tube. The resulting value of SPV is then used to estimate $V_{Si}$ which is then subtracted from $V_{KP}$ by the controller 32 to provide a corrected value for $V_{OX}$.

The light intensity must be sufficient for creating a concentration of excess light induced carriers that is comparable to or greater than the doping concentration of the wafer (e.g., 1E15 carriers/cm$^3$). The excess carriers (electrons and holes) will separate in the silicon surface field, due to $V_{Si}$, and then set up an opposing field that will tend to reduce $V_{Si}$ toward zero. Therefore, the magnitude of the SPV (actually, the change in $V_{Si}$) will tend to be a significant fraction of $V_{Si}$. For silicon, in the depletion regime, the SPV can be as much as 80% of $V_{Si}$. For the accumulation regime, the SPV will tend to be about 30% of $V_{Si}$.

The need to correct for $V_{WF}$ and $V_{Si}$ becomes greater for thinner oxides. An uncorrected error in $V_{WF}$ could be as high as one volt. For a 2,000 Å oxide this could correspond to a tunneling field error of 0.05 Mv/cm which would be a 0.6% error for a nominal tunneling field of about 8 Mv/cm. In contrast, for a 50 Å oxide, the error would go up to 25%. By correcting for $V_{WF}$, this latter error can be reduced to about 5%.

An uncorrected error in $V_{Si}$ can also be significant. Assuming a true oxide conduction current of about 46E-9 amps/cm$^2$, for a 2,000 Å thick oxide, the theoretical drop in oxide voltage per second would be about 265 mv/sec. Without using $V_{WF}$ or $V_{Si}$ correction results, for example, in a measured drop in oxide surface voltage of 283 mv/sec or a 7% error.

In the case of a 50 Å thick oxide, the theoretical drop in oxide voltage per second would be about 7 mv/sec. Without using $V_{WF}$ or $V_{Si}$ correction results, for example, in a measured drop in oxide surface voltage of 30 mv/sec, or 400% error. Correcting the measurement for $V_{Si}$ and $V_{WF}$ realistically reduces the error by a factor of ten.

The theoretical values are based on the Johnson Model, assuming that the excess light induced carrier concentration was a reasonable value equal to ten times the doping concentration of the wafer, which was assumed to be 1E15 toms/cm$^3$.

Figure 4:
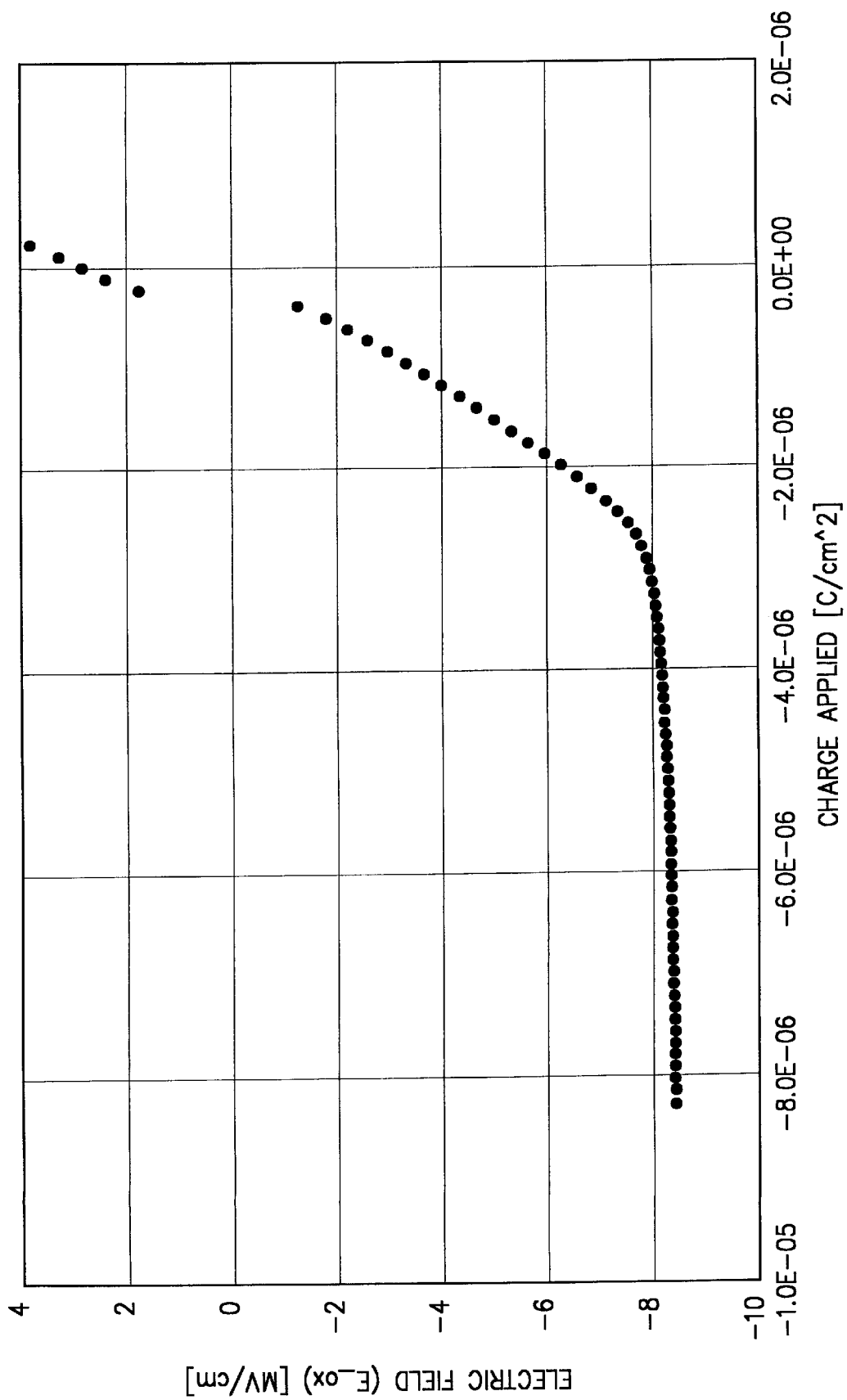
FIG. 4 is an exemplary graph of electric field versus corona charge for a tunneling field test on an oxide.

The measured data can also be advantageously used to determine the tunneling field for an oxide. Referring to FIG. 4, electrical field strength ($V_{OX}/T_{OX}$), as a function of deposited corona charge, $Q_{OX}$ is shown. This is a convenient way of finding the saturating, terminal value of the oxide field corresponding to increasing deposited corona charge density. In FIG. 4, the electric field strength in a 28.8 Å thermal oxide is tending to reach a terminal value as the oxide conduction current (coulombs/sec-cm$^2$), due to tunneling, approaches the rate of corona deposition (coulombs/sec-cm$^2$). This terminal value (here, about 8 Mv/cm) is referred to as the tunneling field.

Tunneling field may also be measured more directly with the apparatus 10. The corona gun 18 is used to deposit a charge on the oxide 12 that would be sufficient to establish a field strength greater than the expected tunneling field (e.g., 7–10 Mv/cm). This predetermined value of excess charge only creates a field corresponding to the tunneling field due to the resulting tunneling current. The resulting $V_{OX}$ is measured with the Kelvin probe 20 and the tunneling field determined from $V_{OX}/T_{OX}$. The repeatability and accuracy of the measurement can be improved by controlling the corona deposition rate, total corona charge and elapsed time before making the $V_{OX}$ measurement.

The method of the invention allows measurement of I-V characteristics and tunneling field without spurious results due to localized defects such as pinholes. Because no conductor is applied to the surface of the dielectric, the localized defects stay localized as only the local corona charge is available to pass through the defect. It is also noted, that for tunneling current measurements, this invention offers the added advantage of not having otherwise, undesirable, enhanced tunneling around the abrupt edge of a MOS electrode. This edge effect problem was discussed in T. B. Hook and T. P. Ma, J. Applied Physics. 59 (11), Jun. 1, 1986. For the Corona-Oxide-Semiconductor electrode used in this invention, the charge density around the effective edge of the electrode will tend to be tapered, as opposed to a MOS electrode.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A method for measuring a current-voltage characteristic for an insulating layer on a substrate, said method comprising:

depositing increments of corona charge on said layer;

measuring a voltage and a derivative of said voltage resulting from a reduction in said charge with respect to time; and determining from said voltage and voltage derivative said current-voltage characteristic.

2. A method according to claim 1, further comprising:

making a calibrating work function voltage measurement of a known material; and correcting said current-voltage characteristic according to said calibrating work function voltage.

3. A method according to claim 1, further comprising:

making a surface photovoltage measurement for said layer; and correcting said current-voltage characteristic according to said surface photovoltage measurement.

4. A method for measuring a current-voltage characteristic for an insulating layer on a substrate, said method comprising:

(a) depositing an increment of corona charge on said layer;

(b) measuring a first voltage across said layer;

(c) pausing an increment of time and then measuring a second voltage across said layer;

(d) determining a difference between said first and second voltages;

(e) determining a value for current across said layer from said difference and said increment of time; and (f) repeating steps a–e to determine said current-voltage characteristic.

5. A method according to claim 4, further comprising:

making a calibrating work function voltage measurement of a known material; and correcting said current-voltage characteristic according to said calibrating work function voltage.

6. A method according to claim 4, further comprising:

making a surface photovoltage measurement for said layer; and correcting said current-voltage characteristic according to said surface photovoltage measurement.

7. A method according to claim 4, further comprising measuring an initial voltage across said layer and forcing the potential of the oxide layer to zero by depositing an initial corona charge on said layer.

8. A method for measuring tunneling field for an oxide layer on a semiconductor wafer, said method comprising:

depositing a predetermined value of excess charge on said layer;

measuring a voltage across said layer; and determining the tunneling field in accordance with said voltage.

9. A method according to claim 8, further comprising:

making a calibrating work function voltage measurement of a known material; and correcting said current-voltage characteristic according to said calibrating work function voltage.

10. A method according to claim 8, further comprising:

making a surface photovoltage measurement for said layer; and correcting said current-voltage characteristic according to said surface photovoltage measurement.

* * * * *

UNITED STATES PATENT AND TRADEMARK OFFICE
CERTIFICATE OF CORRECTION

PATENT NO.    : 6,202,029 B1
DATED         : March 13, 2001
INVENTOR(S)   : Verkuil et al.

Page 1 of 1

It is certified that error appears in the above-identified patent and that said Letters Patent is hereby corrected as shown below:

Column 2,
Line 24, after "determining" insert -- the --.

Column 4,
Line 12, delete "in." and insert therefore -- in --.
Line 31, delee "$\epsilon$" and insert therefore -- Å --.
Line 47, delete "tunneling." and insert therefore -- tunneling --.

Column 5,
Line 11, delete "$W_{KP=VKP2}-W_{REF}$" and insert therefore -- $W_{KP}=V_{KP}-W_{REF}$ --.
Line 57, delete "toms/cm$^3$" and insert therefore -- atoms/cm$^3$ --.

Signed and Sealed this

Twenty-sixth Day of February, 2002

Attest:

Attesting Officer

JAMES E. ROGAN
*Director of the United States Patent and Trademark Office*